(12) United States Patent
Yamamoto et al.

(10) Patent No.: US 8,829,776 B2
(45) Date of Patent: Sep. 9, 2014

(54) LIGHT-SOURCE CIRCUIT UNIT, ILLUMINATION DEVICE, AND DISPLAY DEVICE

(75) Inventors: Koichi Yamamoto, Kanagawa (JP); Takehito Hirose, Aichi (JP); Shigeru Teshigahara, Gifu (JP)

(73) Assignee: Sony Corporation, Tokyo (JP)

( * ) Notice: Subject to any disclaimer, the term of this patent is extended or adjusted under 35 U.S.C. 154(b) by 197 days.

(21) Appl. No.: 13/428,351

(22) Filed: Mar. 23, 2012

(65) Prior Publication Data

US 2012/0243261 A1 Sep. 27, 2012

(30) Foreign Application Priority Data

Mar. 23, 2011 (JP) ................................. 2011-064582

(51) Int. Cl.
| | | |
|---|---|---|
| *H01L 33/62* | (2010.01) | |
| *H01L 33/60* | (2010.01) | |
| *H01L 33/46* | (2010.01) | |
| *H01L 25/075* | (2006.01) | |
| *H05K 3/28* | (2006.01) | |
| *G02F 1/1335* | (2006.01) | |
| *H05K 3/00* | (2006.01) | |
| *H01L 33/54* | (2010.01) | |
| *H01L 33/64* | (2010.01) | |
| *H05K 1/18* | (2006.01) | |

(52) U.S. Cl.
CPC .......... *H01L 25/0753* (2013.01); *H05K 3/0061* (2013.01); *H05K 2201/0209* (2013.01); *H01L 33/60* (2013.01); *H01L 2224/49107* (2013.01); *H01L 33/54* (2013.01); *H01L 33/64* (2013.01); *H01L 2224/73265* (2013.01); *H01L 2224/48091* (2013.01); *H05K 2201/10106* (2013.01); *H01L 2224/48464* (2013.01); *H05K 3/28* (2013.01); *H05K 1/189* (2013.01); *G02F 1/133603* (2013.01); *H05K 2201/2054* (2013.01)
USPC ........... 313/498; 362/97.3; 362/97.1; 257/81; 257/99

(58) Field of Classification Search
USPC .......................... 257/98–100; 362/97.1–97.4; 313/498–512; 349/58–60
See application file for complete search history.

(56) References Cited

U.S. PATENT DOCUMENTS

| | | | |
|---|---|---|---|
| 7,728,343 B2 | 6/2010 | Fujino et al. | |
| 7,898,614 B2* | 3/2011 | Mishima et al. | ................ 349/65 |
| 2007/0096129 A1* | 5/2007 | Park | ............................... 257/98 |
| 2007/0228386 A1* | 10/2007 | Shie et al. | ........................ 257/79 |
| 2010/0207154 A1* | 8/2010 | Song et al. | ........................ 257/98 |

FOREIGN PATENT DOCUMENTS

JP 4107349 4/2008

OTHER PUBLICATIONS

U.S. Appl. No. 13/421,110, filed Mar. 15, 2012, Yamamoto.

* cited by examiner

*Primary Examiner* — Mariceli Santiago
(74) *Attorney, Agent, or Firm* — Oblon, Spivak, McClelland, Maier & Neustadt, L.L.P.

(57) ABSTRACT

There are provided a light-source circuit unit, an illumination device, and a display device which are capable of extracting light emitted from the back surface of a light-emitting element chip to the front surface, suppressing a reduction in reflectance, and reducing cost, with a simple configuration. The light-source circuit unit includes a circuit substrate that has a light-reflective wiring pattern on a surface thereof and includes a chip mounting layer as a part of the wiring pattern, and one or more light-emitting element chips that are directly placed on the chip mounting layer, and are driven by a current flowing through the wiring pattern.

20 Claims, 8 Drawing Sheets

LIGHT-SOURCE CIRCUIT UNIT, ILLUMINATION DEVICE, AND DISPLAY DEVICE

BACKGROUND

The present technology relates to a light-source circuit unit and an illumination device which include, as a light source, light emitting elements such as light emitting diodes (LEDs), and a display device including the illumination device as a backlight.

The light emitting diodes (LEDs) have been noticed as a backlight (light source) of a liquid crystal display device or a light source of an illumination device in place of an incandescent lamp or a fluorescent lamp. Since LED emits light from surfaces in all directions, a certain reflective surface needs to be provided on the back surface of an LED chip to extract light emitted from the back surface to the front surface. A lead frame or a wiring pattern for supplying a current to the LED chip typically includes copper (Cu). In an exemplary method of extracting light emitted from the back surface of the LED chip to the front surface, a circuit substrate having such a wiring pattern has a white resist layer thereon, and the white resist layer is used as a reflective layer, as disclosed in Japanese Patent No. 4107349. The light emitted from the back surface of the LED chip is reflected to the front surface by the white resist layer and extracted.

SUMMARY

If such a white resist layer is heated in a treatment step after die bonding, wire bonding, or soldering of the LED chip, the white resist layer becomes yellowish, and the reflectance of the layer is reduced. In other methods of extracting light, white paste is used for chip bonding, or a reflective layer (silver plating layer) is provided on the back surface of the LED chip. Unfortunately, each method leads to an increase in cost.

It is desirable to provide a light-source circuit unit, an illumination device, and a display device which are capable of extracting light emitted from the back surface of a light-emitting element chip to the front surface, suppressing a reduction in reflectance, and reducing cost, with a simple configuration.

A light-source circuit unit according to an embodiment of the technology includes a circuit substrate that has a light-reflective wiring pattern on a surface thereof and includes a chip mounting layer as a part of the wiring pattern; and one or more light-emitting element chip that is directly placed on the chip mounting layer, and is driven by a current flowing through the wiring pattern.

An illumination device and a display device according to the embodiment of the technology each include the light-source circuit unit.

In the light-source circuit unit, the illumination device, and the display device according to the embodiment of the technology, light emitted from the back surface of the light-emitting element chip is reflected by the light-reflective chip mounting layer, on which the relevant chip is mounted, and the light is extracted from the front surface of the chip.

According to the light-source circuit unit, the illumination device, and the display device of the embodiment of the technology, a part of the light-reflective wiring pattern is formed as the chip mounting layer, and the light-emitting element chip is directly placed on the chip mounting layer, which allows light emitted from the back surface of the light-emitting element chip to be extracted to the front surface in a simple configuration, and eliminates a reduction in reflectance.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF EMBODIMENTS

Hereinafter, an embodiment of the disclosure will be described in detail with reference to accompanying drawings. Description is made in the following order.

1. Embodiment (an example where an LED chip is directly die-bonded to a wiring pattern).
2. Modification 1 (an example where a reflective layer is added).
3. Modification 2 (an example where a reflective sheet is further added).
4. Modification 3 (an example where a radiating function is added).
5. Application example 1 (an example of direct-type backlight).
6. Application example 2 (an example of partitioned substrates).
7. Application example 3 (an example where a circuit substrate is folded and connected to a drive substrate on a back side of a support member).

8. Application example 4 (an example where a circuit substrate is curved together with a support member).

9. Application example 5 (an example of an edge-type backlight).

[Embodiment]

Figure 1:
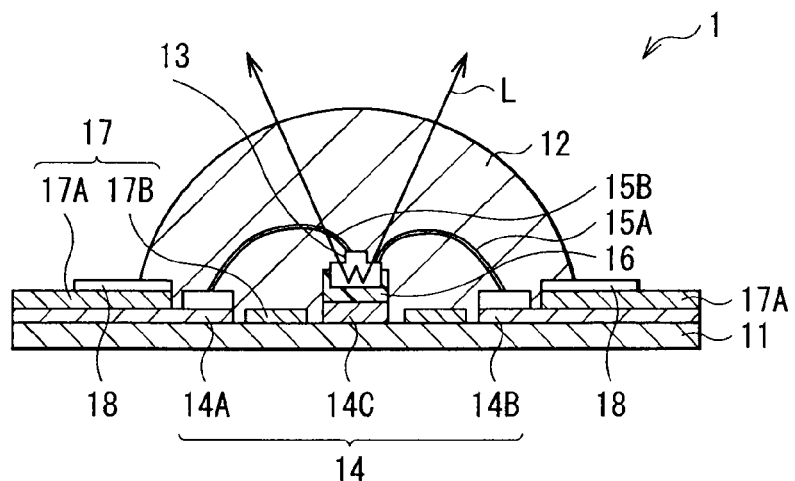
FIG. 1 is a sectional view illustrating a light-source circuit unit according to an embodiment of the disclosure.

FIG. 1 illustrates a configuration of a light-source circuit unit 1 according to an embodiment of the disclosure. This light-source circuit unit 1 is used, for example, as a backlight of a display device such as a liquid-crystal display device or as a light-source circuit unit in place of an incandescent lamp or a fluorescent lamp. The light-source circuit unit includes a light-emitting element chip, for example, an LED chip 13, covered with a domed sealing lens 12 on a circuit substrate 11. While the number of LED chips 13 is one herein, it may be two or more as in modifications described below. In the case where the light-source circuit unit 1 is applied to a direct-type backlight, a large number of LED chips 13 are used in a matrix.

The circuit substrate 11 has a light-reflective wiring pattern 14 on a surface thereof. The wiring pattern 14 includes, for example, a wiring layer 14A (first wiring layer) and a wiring layer 14B (second wiring layer) for supplying a drive current to the LED chip 13, and a chip mounting layer 14C for mounting of the LED chip 13. The wiring layers 14A and 14B and the chip mounting layer 14C are formed of a conductive and light-reflective material in one step, and are electrically separated from one another. In the embodiment, the chip mounting layer 14C functions only as a base of the LED chip 13 and does not function as a wiring. Here, "light-reflective" refers to a property of reflecting light emitted from (the back surface of) the LED chip 13 at a high reflectance of 90% or more. Such a light-reflective material specifically includes, for example, aluminum (al), silver (Ag), or alloys thereof. Among them, Al is most preferable in the light of cost.

Incidentally, the wiring layers 14A and 14B and the chip mounting layer 14C are preferably formed of the same material and in the same step to simplify the process as described above. However, if the chip mounting layer 14C has a light-reflective function, the chip mounting layer 14C may be formed of a different material and in a different step from the wiring layers 14A and 14B.

Figure 2:
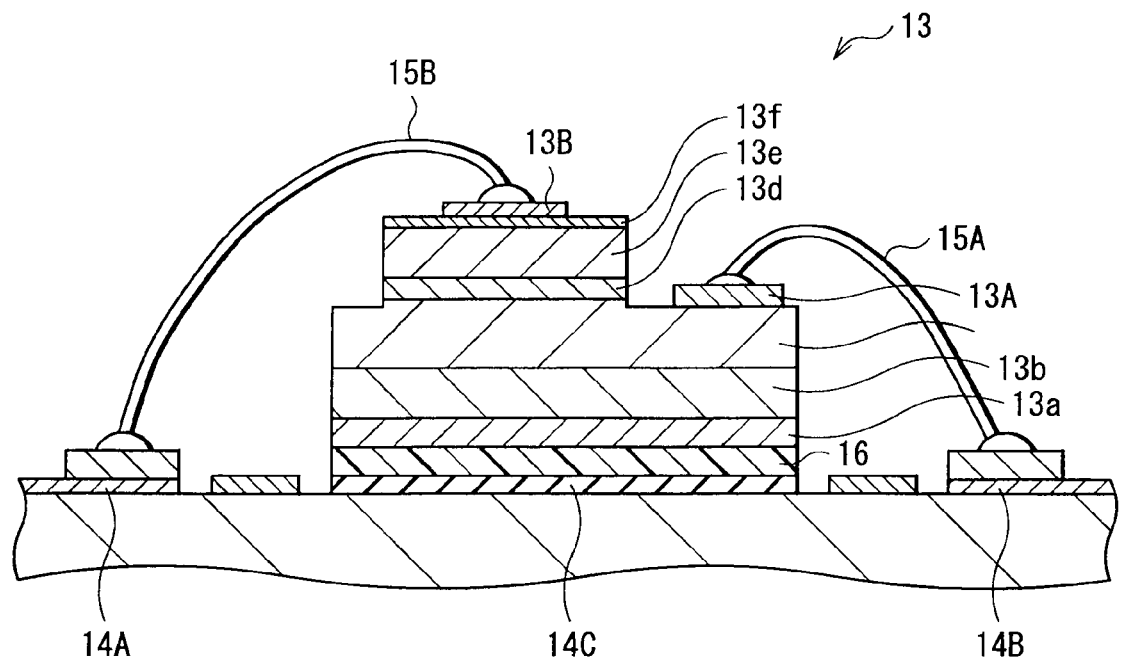
FIG. 2 illustrates an electrode configuration of an LED chip.

The LED chip 13 has two electrodes (an n-type electrode 13A and a p-type electrode 13B) on a surface thereof, for example, as shown in FIG. 2. The LED chip 13 includes, for example, a buffer layer 13b, an n-type clad layer 13c, an active layer 13d, a p-type clad layer 13e, and a cap layer 13f on a transparent substrate 13a. The n-type electrode 13A is electrically connected to the n-type clad layer 13c, and the p-type electrode 13B is electrically connected to the cap layer 13f.

The n-type electrode 13A and the p-type electrode 13B of the LED chip 13 are electrically connected to the wiring layers 14A and 14B through wirings (bonding wires) 15A and 15B including aluminum (Al) or gold (Au), respectively. Specifically, the LED chip 13 is driven by a current flowing through the wiring layers 14A and 14B and the wirings 15A and 15B for light emission.

In the embodiment, the LED chip 13 is directly mounted on the chip mounting layer 14C. Here, "directly" means that the back surface (the above-described transparent substrate) itself of the LED chip 13 is fixed to the chip mounting layer 14C with the die bonding or the like without packaging the LED chip 13 or without providing a reflective layer such as a tin or gold plating layer between the chip mounting layer 14C and the LED chip 13. Incidentally, an adhesive layer including a transparent paste 16 for the die bonding may be interposed between the chip mounting layer 14C and the LED chip 13, as shown in FIG. 1. While the transparent paste 16 is not conductive in the embodiment, in the case where an LED chip having electrodes on both sides thereof is used, the transparent paste 16 is conductive because the chip mounting layer 14C functions as a current path, as described below.

The circuit substrate 11 is preferably flexible and foldable, and may specifically include a resin film, such as polyethylene terephthalate (PET), fluoric resin, or polyethylene naphthalate (PEN), having the wiring pattern 14 printed thereon. Thickness of the resin film is, for example, 20 μm to 50 μm both inclusive, and thickness of the wiring pattern 14 is, for example, 35 μm to 50 μm both inclusive; however, these are not limitative.

Alternatively, the circuit substrate 11 may include a metal-base substrate including Al, which has an insulating resin layer such as polyimide or epoxy resin on a surface thereof and has the wiring pattern including the reflective material printed on the insulating resin layer. Alternatively, the circuit substrate 11 may include a film base including a glass-contained resin such as glass epoxy resin (FR4) or glass composite resin (CEM3), on which the wiring pattern including the reflective material is printed.

A white resist layer 17A and a water repellent layer 18 enclosing the LED chip 13 are stacked in this order between the respective wiring layers 14A and 14B and the periphery of the sealing lens 12. In addition, a white resist layer 17B is provided on the circuit substrate 11 between the chip mounting layer 14C and the respective wiring layers 14A and 14B within a region covered with the sealing lens 12. The white resist includes, for example, an inorganic material such as titanium oxide ($TiO_2$) fine-particle and barium sulfate ($BaSO_4$) fine-particle, and an organic material such as porous acrylic-resin fine-particle or polycarbonate-resin fine-particle having innumerable pores for light scattering. Specifically, for example, a solder resist, FINEDEL DSR-330 S42-13W (brand name, manufactured by TAMURA KAKEN CORPORATION), may be used. The white resist layers 17 (17A and 17B) each have a certain light reflecting function (a reflectance of the lower half of the 80% range) though the reflectance may be inconveniently reduced. In the embodiment, the white resist layers 17 (17A and 17B) function as reflective layers (auxiliary reflective layers) in the periphery of the LED chip 13. While the resist layers 17A and 17B are separated from each other in FIG. 1, they are provided as a solid film on the entire surface of the circuit substrate 11 except for a mounting region of the LED chip 13 and connection regions of the LED chip 13 to the wiring layers 14A and 14B. The water repellent layer 18 is provided to form the sealing lens 12 covering the LED chip 13 into a predetermined shape. The water repellent layer 18 is formed of a water repellent material such as fluoric resin, and has a pattern (for example, a ring pattern) corresponding to a bottom pattern of the sealing lens 12.

The sealing lens 12 protects the LED chip 13, and improves the extraction efficiency of light L emitted from the LED chip 13. The sealing lens 12 includes, for example, a transparent resin such as silicon or acrylic resin, and covers the entirety of the LED chip 13.

The sealing lens 12 may contain a fluorescent substance. For example, the transparent resin such as silicon or acrylic resin is kneaded together with the fluorescent substance at a weight ratio of 10%, and thus a color tone of light emitted from the entire LED chip 13 may be adjusted. Specifically, when light having a predetermined wavelength is emitted from the LED chip 13, the fluorescent substance contained in the sealing lens 12 is excited, leading to output of light having a wavelength different from the emitted wavelength. The fluorescent substance may include, for example, an yttrium/aluminum/garnet (YAG) fluorescent substance.

The light-source circuit unit 1 may be produced according to the following process, for example.

First, the transparent paste 16 is applied onto the chip mounting layer 14C of the wiring pattern 14 beforehand provided on the circuit substrate 11 as described above, and the LED chip 13 is mounted on the chip mounting layer 14C, and then the paste 16 is heated to be cured. Then, the respective two electrodes (the n-type electrode 13A and the p-type electrode 13B) of the LED chip 13 are wire-bonded to the wiring layers 14A and 14B with the wirings 15A and 15B.

After that, the resist layer 17 is formed on the entire surface of the circuit substrate 11 except for the mounting region of the LED chip 13 and the connection regions between the LED chip 13 and the wiring layers 14A and 14B. The water repellent layer 18 is then formed on the resist layer 17, and then potting is performed around the LED chip 13 fixed onto the chip mounting layer 14C with, for example, silicon resin as the sealing agent. An appropriate amount of resin material is used for such potting, and the resin material is cured through heating for 4 hours at a temperature of 150° C., for example. Consequently, the domed sealing lens 12 is formed, and the light-source circuit unit 1 shown in FIG. 1 may be achieved.

In the light-source circuit unit 1, light emitted from the LED chip 13 is largely extracted to the front through the sealing lens 12, but partially goes to the circuit substrate 11 from the back surface of the LED chip 13 (back emission light). The back emission light is reflected by the surface of the chip mounting layer 14C having high light-reflective-function, on which the LED chip 13 is mounted, and extracted to the front as shown by an arrow L in FIG. 1. In the case where a diffuser sheet (not shown) is disposed above the light-source circuit unit, part of the reflected light is reflected by the diffuser sheet and returned to the circuit substrate 11, and also returned again to the diffuser sheet by the white resist layer 17 that has the light-reflective function.

In this way, in the embodiment, the LED chip 13 is directly die-bonded onto the partial region (the chip mounting layer 14C) of the high-reflectance wiring pattern 14 including Al, and the chip mounting layer 14C is used as a reflective layer. Hence, expensive silver plating is unnecessary for the reflective layer, and a typical LED chip may be used as it is without need of beforehand formation of a reflective layer on the back surface of the chip. In addition, a typical (inexpensive) transparent paste may be used as a bonding paste. Consequently, a configuration for extracting light and a manufacturing process are simplified, and a reduction in cost is achieved.

Modifications 1 to 3 of the above-described embodiment are described below. The components common to those in the above-described embodiment are designated by the same symbols, and description of the components and of the common advantages are omitted.

(Modification 1)

Figure 3A:
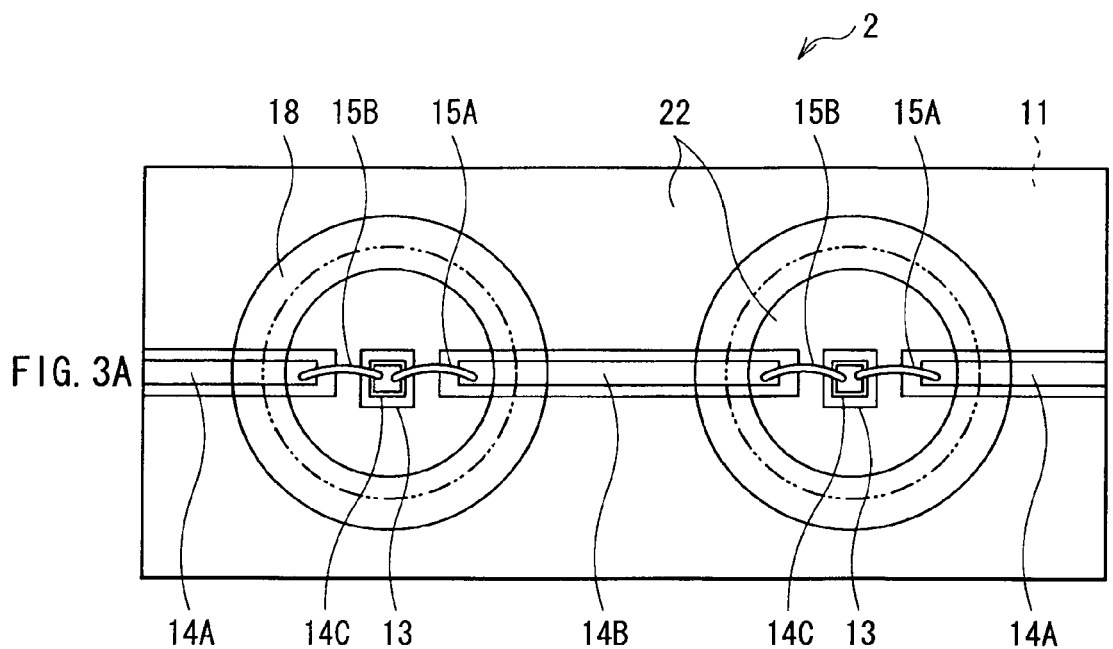
FIGS. 3A and 3B are a plan view and a sectional view illustrating a light-source circuit unit according to modification 1, respectively.
Figure 3B:
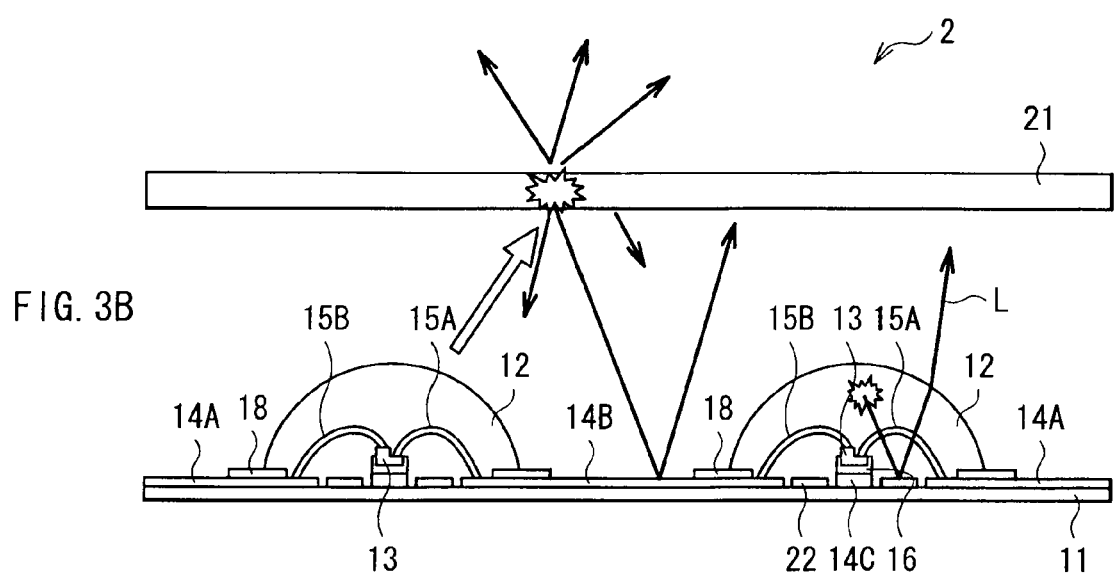

A light-source circuit unit 2 shown in FIGS. 3A and 3B has a plurality of (for example, two) LED chips 13, each of which is covered with the sealing lens 12 as described above, on the circuit substrate 11. A reflective layer 22 including the same reflective material (for example, Al) as that of the wiring pattern 14 is provided over the substantially entire area of an uncovered portion of the wiring pattern 14 (the wiring layers 14A and 14B and the chip mounting layer 14C) on the circuit substrate 11 through the same printing step as that of the wiring pattern 14. An optical sheet such as a diffuser sheet 21 is disposed above the light-source circuit unit 2.

In the light-source circuit unit 2, the back emission light going from the back surface of the LED chip 13 to the circuit substrate 11 is reflected by a surface of the chip mounting layer 14C having a light-reflective function and extracted to the front as shown by the arrow in FIG. 1, as in the above-described embodiment. In addition, in the light-source circuit unit 2, the light extracted to the front is largely diffused by the diffuser sheet 21, but partially reflected by the sheet and returned to the circuit substrate 11. The light returned from the diffuser sheet 21 is effectively reflected again to the diffuser sheet 21 by the reflective layer 22 provided in the uncovered region of the wiring pattern 14. In the case where the sealing lens 12 contains a fluorescent substance, light which is emitted within the sealing lens 12 and goes to the circuit substrate 11 is also reflected to the diffuser sheet 21 by the reflective layer 22.

If the white resist used in the light-source circuit unit 1 is heated during the treatment step after die-bonding, wire-bonding, or soldering, the reflectance of the white resist may be reduced. In the light-source circuit unit 2, however, since the reflective layer 22 is provided through the same printing step as that of the wiring pattern 14 in place of the white resist, the reflectance is not reduced, and a reduction in cost is achievable.

(Modification 2)

Figure 4A:
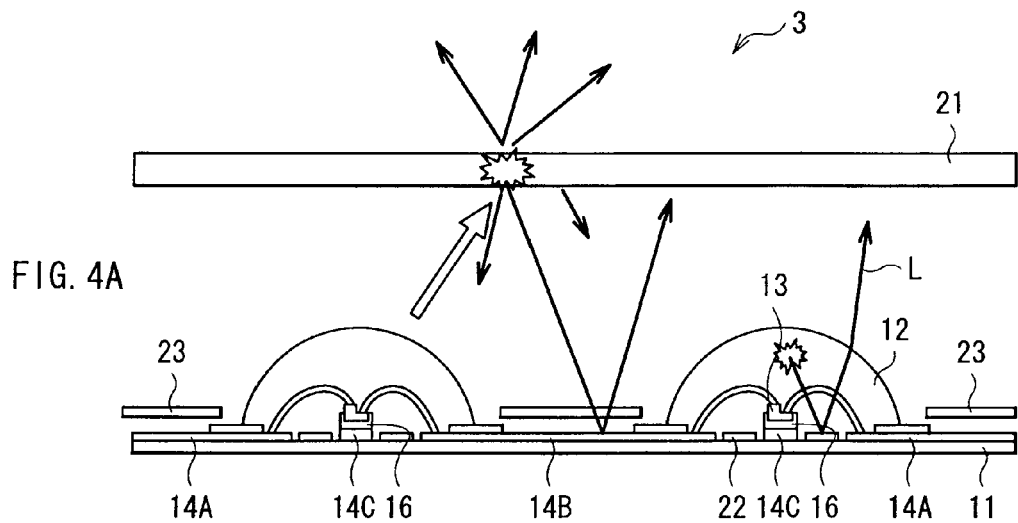
FIGS. 4A and 4B are a sectional view illustrating a light-source circuit unit according to modification 2 and a plan view illustrating a reflective sheet.
Figure 4B:
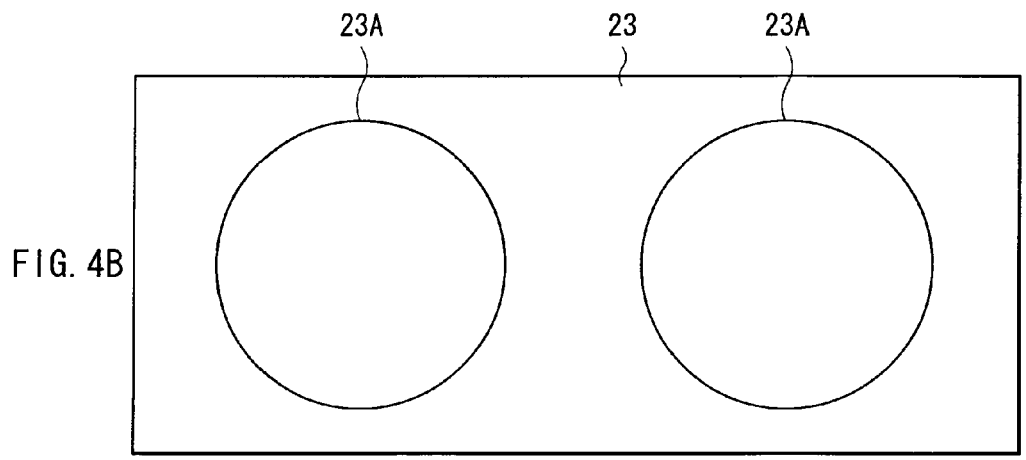

In a light-source circuit unit 3 shown in FIG. 4A, a reflective sheet 23 is further provided above the reflective layer 22 between the LED chips 13 and 13 of the light-source circuit unit 2 of the modification 1 in order to achieve a further increase in luminance. FIG. 4B illustrates a planar configuration of the reflective sheet 23, where openings 23A are provided at positions corresponding to the sealing lenses 12. For the reflective sheet 23, while the same material (for example, Al) as that for the wiring pattern 14 may be used, a material having a higher reflectance, for example, white PET may be used.

(Modification 3)

Figure 5:
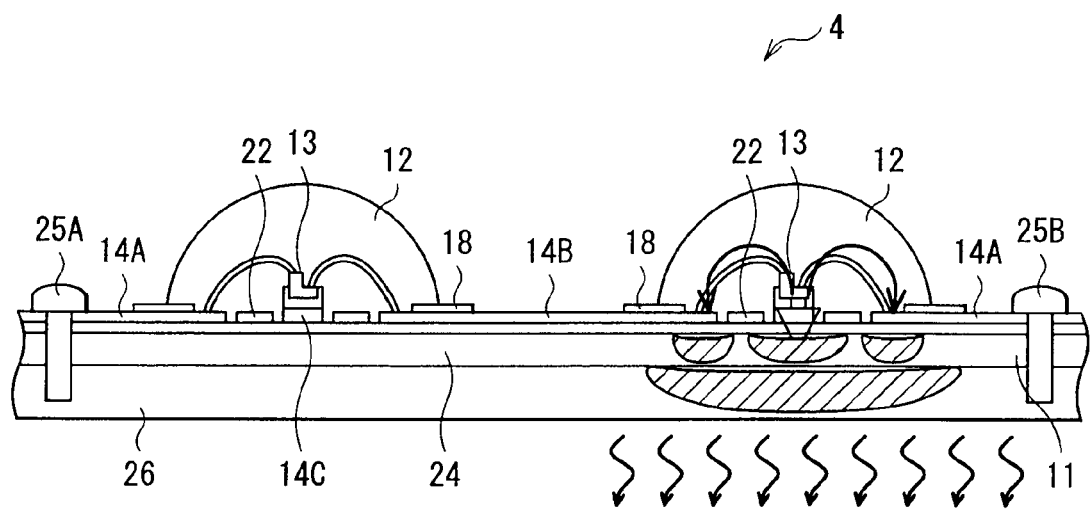
FIG. 5 is a sectional view illustrating a light-source circuit unit according to modification 3.
Figure 6:
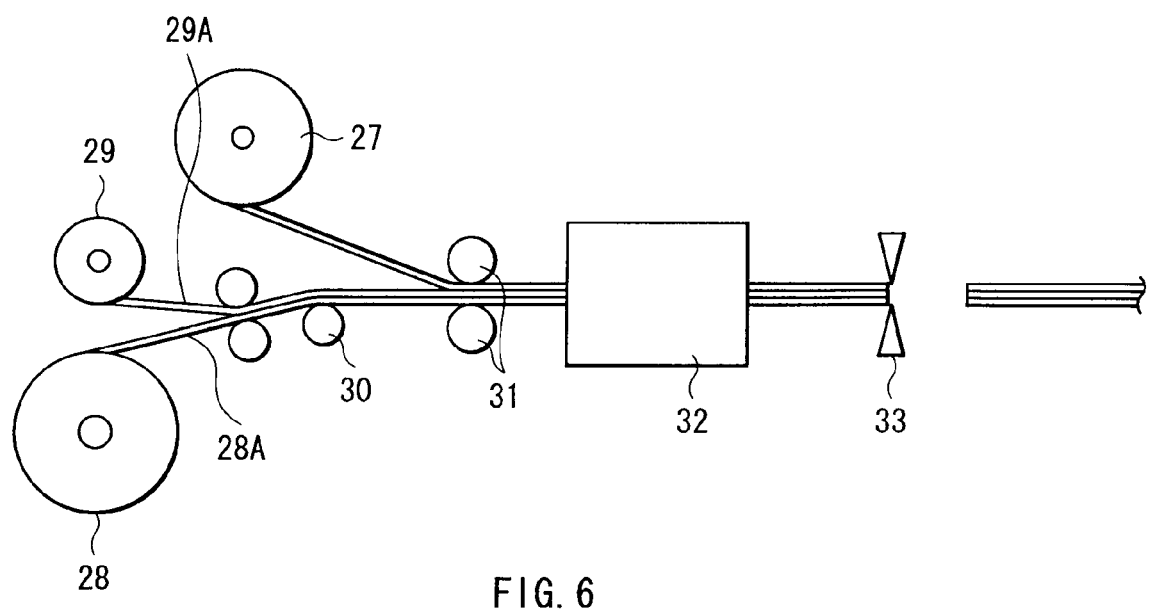
FIG. 6 illustrates a manufacturing process of a circuit substrate of the light-source circuit unit according to modification 3.

In a light-source circuit unit 4 shown in FIG. 5, a heat-radiating metal sheet 24 is laminated on the back surface of the circuit substrate 11 of the above-described light-source circuit unit 2 and fixed to a back chassis 26 together with the circuit substrate 11 with screws 25A and 25B. The metal sheet 24 specifically includes an Al or Cu sheet having a thickness of 50 µm to 150 µm both inclusive, for example. If the metal sheet 24 has such a range of thickness, the circuit substrate 11 may be folded together with the metal sheet 24. The metal sheet 24 may be integrally attached to the back surface of the circuit substrate 11 by a roll-to-roll process, for example, as shown in FIG. 6. Specifically, a resin film 27A, an Al sheet 28A, and an adhesive sheet 29A are fed from a resin film roll 27, an Al sheet roll 28, and an adhesive roll 29, respectively, through an intermediate roll 30. The Al sheet 28A is laminated on the entire back surface of the resin film roll 27A by a pressure roll 31. After that, a wiring pattern of Al or the like is printed on a surface of the resin film 27A by a wiring pattern printer 32. The resin film 27A on which the wiring pattern is printed is cut into a desired size by a cutter 33, and consequently the circuit substrate 11 having the metal sheet 24 on its back surface is produced. It is noted that the above-described method is not limitative, and other methods, which may provide the metal sheet 24 on the circuit substrate 11 without creases before die bonding of the LED chip 13, may be used. As the adhesive agent, for example, epoxy resin is used. It is noted that high heat-conductive particles such as alumina particles may be mixed in the adhesive agent to increase heat conductivity in order to improve a heat-radiating effect described below.

The metal sheet 24 is provided on the back surface without creases in this way, and thus the circuit substrate 11 becomes tough (has a certain strength) despite of its flexibility, allowing die bonding or wire bonding using a typical substrate-fixing process with adsorption.

Figure 7:
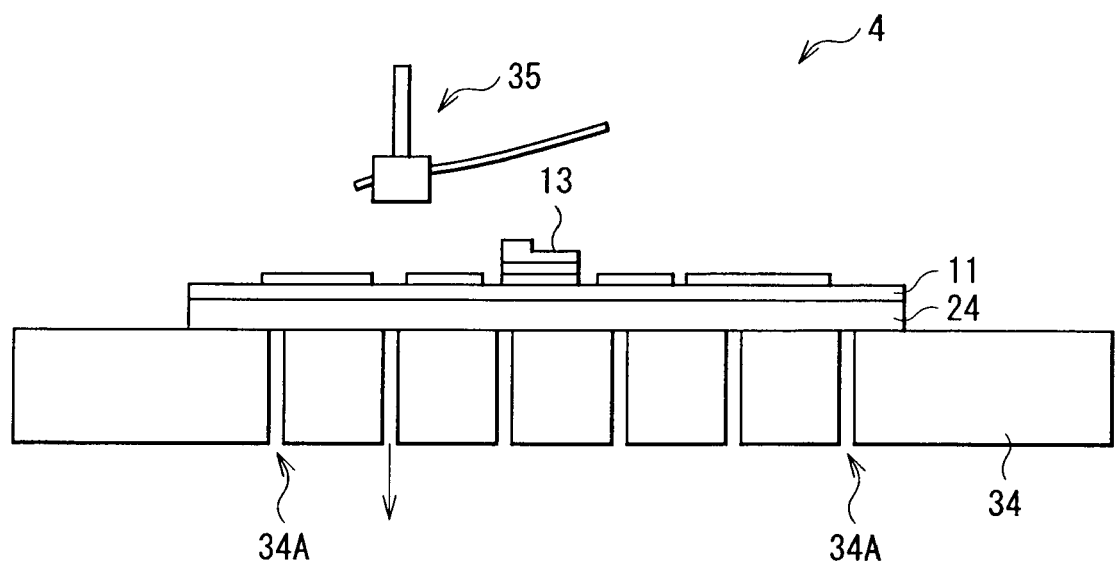
FIG. 7 illustrates a manufacturing process of the light-source circuit unit according to modification 3.

FIG. 7 illustrates a process of fixing a substrate with a wire bonder. In the wire bonder, the circuit substrate 11 is disposed on a base 34 having a plurality of adsorption ports 34A so that the circuit substrate 11 is fixed on the base 34 by vacuum adsorption through the adsorption ports 34A. In this state, wire bonding is performed with a head 35. Since the circuit substrate 11 in the modification 3 at this time has an appropriate hardness due to the metal sheet 24, creases hardly occur in the circuit substrate 11. Consequently, automatic wire bonding may be performed merely using a typical bonder without increasing the number of the adsorption ports 34A.

In addition, in the embodiment, heat generated from the LED chip 13 is transmitted to the entire surface of the metal sheet 24 (Al sheet), and efficiently transmitted to the back chassis 26 via the metal sheet 24. Specifically, the metal sheet 24 may effectively provide a heat radiating effect. In addition, in the case where the metal sheet 24 and the reflective layer 22 on the front surface side of the circuit substrate 11 include the same material, for example, Al, and have the same thickness, a thermal expansion coefficient is substantially the same between two sides of the circuit substrate 11, thereby leading to an effect of suppressing occurrence of a warpage of the circuit substrate 11.

The above-described light-source circuit units 1 to 4 are foldable and thus may be applied to illumination devices for various applications such as streetlights or illuminations for surgical operations. In addition, each light-source circuit unit may be applied to a backlight (an illumination device) of a display device such as a liquid crystal display device. In such a case, the light-source circuit unit may be applied to either of the direct-type backlight where the light source unit is disposed directly below a liquid crystal panel and the edge-type backlight where the light source is disposed on an edge of a light guide plate.

(Application Example) 1

Figure 8:
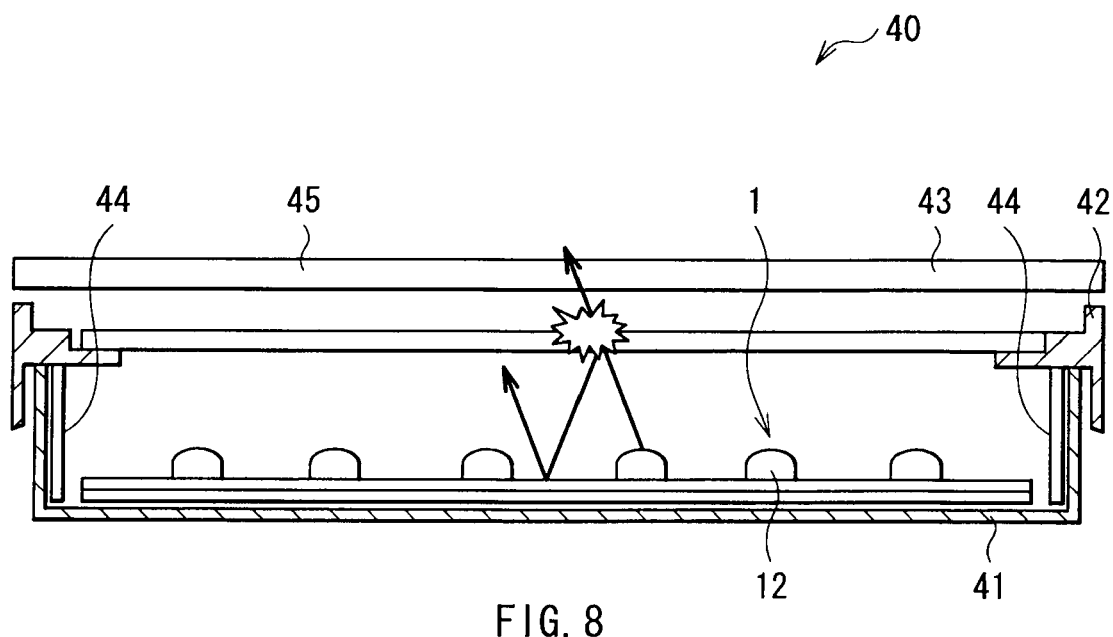
FIG. 8 is a sectional view illustrating a liquid crystal display device according to application example 1.

FIG. 8 illustrates a configuration of a liquid crystal display device using a direct-type backlight 40. The backlight 40 includes, for example, the light-source circuit unit 1 disposed on a bottom of a back chassis 41 (support member). A middle chassis 42 supports an optical sheet, for example, a diffuser sheet 43 above the light-source circuit unit 1. A diffuser sheet 44 is also provided on each sidewall of the back chassis 41.

In the liquid crystal display device, light L extracted from the sealing lens 12 of the light-source circuit unit 1 largely passes through the diffuser sheet 43 and reaches a liquid crystal panel 45, and part of the light L is reflected by the diffuser sheets 43 and 44. The reflected light is returned to the diffuser sheet 43 by the above-described white resist layer or reflective sheet and reaches the liquid crystal panel 45, resulting in image display.

(Application Example) 2

Figure 9A:
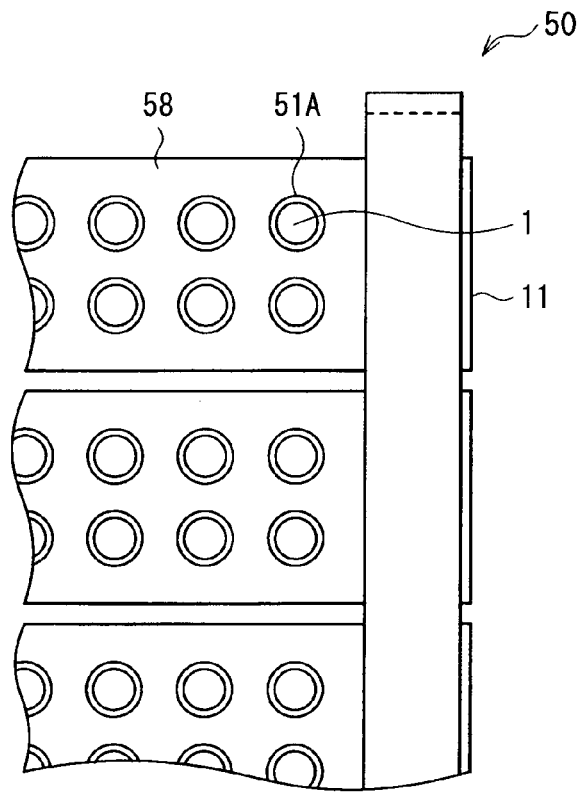
FIGS. 9A and 9B are a plan view and a sectional view illustrating a major part of a liquid crystal display device according to application example 2, respectively.
Figure 9B:
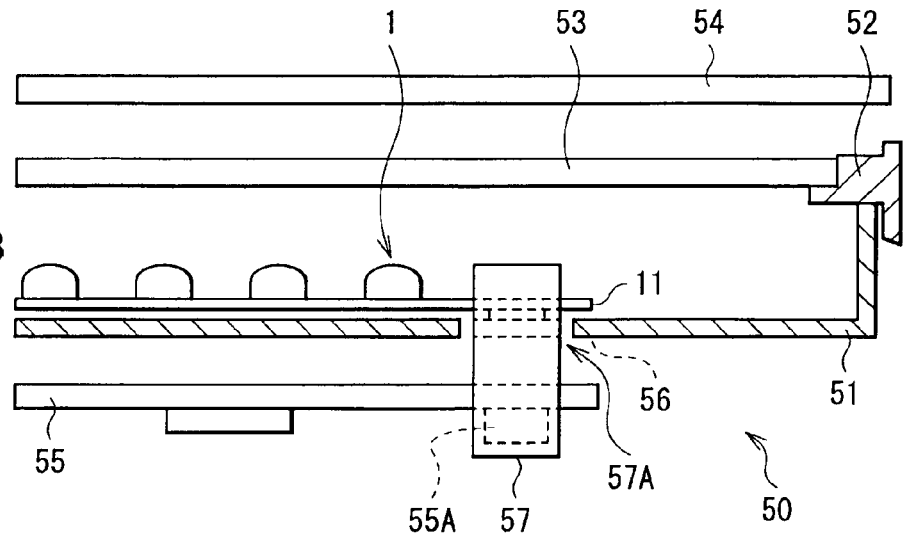

In the direct-type backlight as described above, it is difficult to manufacture a large light-source circuit unit 1 because of manufacturing reasons of the substrate, so that the substrate is partitioned into small pieces in some cases. FIGS. 9A and 9B illustrate a configuration of a backlight 50 using such partitioned substrates. FIG. 9A shows a planar configuration of the backlight 50, and FIG. 9B shows a sectional configuration thereof. The backlight 50 includes, for example, the light-source circuit units 1 disposed on a bottom of a back chassis 51 (support member). The plurality of light-source circuit units 1 are provided in parallel, and a reflective sheet 58 is provided in common for the plurality of light-source circuit units 1. The reflective sheet 58 is formed of for example, Al, and has openings 51A corresponding to the LED chips 13.

A middle chassis 52 supports a diffuser sheet 53 above the light-source circuit units 1. A liquid crystal panel 54 is provided in front of the backlight 50. An LED drive circuit substrate 55 for supplying a drive current to the light-source circuit units 1 is provided on the back surface of the back chassis 51. The LED drive circuit substrate 55 has a connector 55A. One end of a flexible flat cable (FFC) 57 is bonded to one side of the reflective sheet 51 by thermocompression bonding with anisotropic conductive resin (ACF) 56 therebetween. The back chassis 51 has a through-hole 57A having a shape corresponding to an end pattern (a rectangle) of the FFC 57. The FFC 57 is folded from the inside of the back chassis 51 along the back surface thereof through the through-hole 57A. An end of the FFC 57 is formed as a plug that is inserted into a connector 55A of the LED drive circuit substrate 55 for electrical coupling.

In the liquid crystal display device having such a backlight 50, since the partitioned substrates are used, even if a defective substrate is partially produced due to the die bonding, only the defective substrate needs to be repaired without need of repairing all the substrates.

(Application Example) 3

Figure 10:
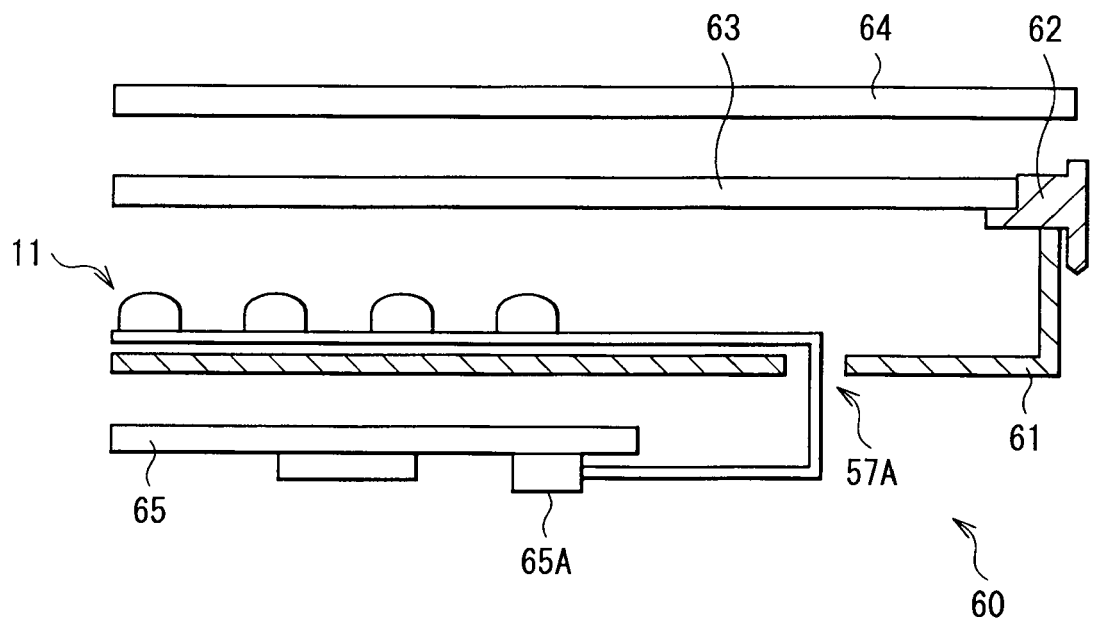
FIG. 10 is a sectional view illustrating a liquid crystal display device according to application example 3.

FIG. 10 illustrates a configuration of a liquid crystal display device according to application example 3. A backlight 60 includes, for example, the light-source circuit unit 1 disposed on a bottom of a back chassis 61. A middle chassis 62 supports a diffuser sheet 63 above the light-source circuit unit 1. A liquid crystal panel 64 is provided in front of the backlight 60. An LED drive circuit substrate 65 is provided on the back surface of the back chassis 61. The LED drive circuit substrate 65 has a connector 65A. The back chassis 61 has a through-hole 61A having a section corresponding to an end face pattern (a rectangle) of the circuit substrate 11 of the light-source circuit unit 1. An end portion of the circuit substrate 11 is folded along the back surface of the back chassis 61 through the through-hole 61A. An end of the circuit substrate 11 is formed as a plug that is inserted into a connector 65A of the LED drive circuit substrate 65 for electrical coupling. In the case where the wiring pattern 14 on the circuit substrate 11 is formed of Al, and a terminal of the connector 65A is formed with gold (Au) plating, an end of the plug of the circuit substrate 11 is desirably plated with gold or tin in order to prevent electrolytic corrosion caused by a dissimilar metal.

In the past, the LED circuit substrate has been electrically connected to the LED drive circuit substrate through coupling between connectors of the respective substrates with a wiring member such as FFC or a harness. However, since a unit price of LED itself has been greatly lowered, cost of a connector terminal or a wiring member is not negligible. In the embodiment, the circuit substrate 11 of the light-source circuit unit 1 is flexible and is foldable to the back surface side of the back chassis 61 as shown in FIG. 10, and thus the connector and the wiring member on the circuit substrate 11 are unnecessary, enabling a reduction in the number of components and in cost.

(Application Example) 4

Figure 11:
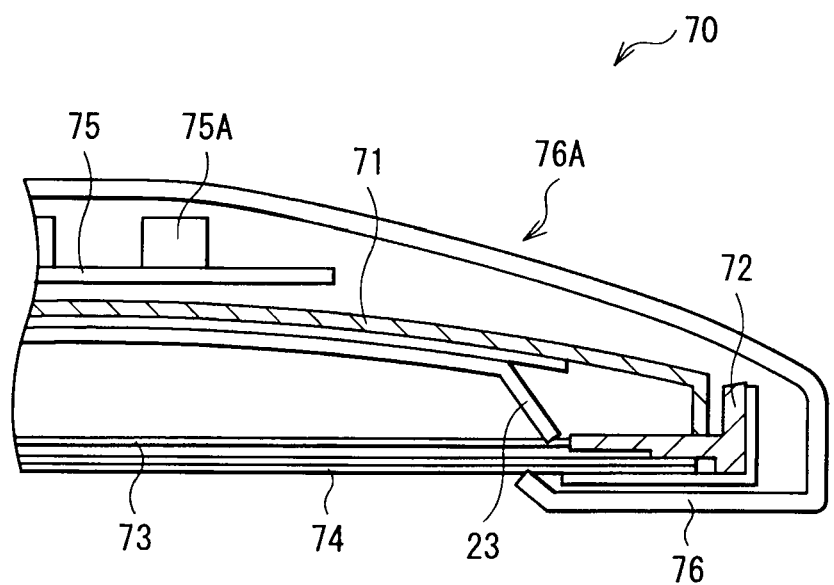
FIG. 11 is a sectional view illustrating a liquid crystal display device according to application example 4.

FIG. 11 also illustrates a configuration of a liquid crystal display device including a direct-type backlight. A backlight 70 includes, for example, the light-source circuit unit 1 disposed on a bottom of a back chassis 71. A middle chassis 72 supports a diffuser sheet 73 above the light-source circuit unit 1. The light-source circuit unit 1 further has the reflective sheet 23. A liquid crystal panel 74 is provided in front of the backlight 70. An LED drive circuit substrate 75 for supplying a drive current to the light-source circuit unit 1 is provided on the back surface of the back chassis 71. The LED drive circuit substrate 75 has a connector 75A. The light-source circuit unit 1 is electrically connected to the LED drive circuit substrate 75 in the same way as in the application example 3. A rear cover 76 (back protective member) covers from the back surface of the back chassis 71 to the periphery of the front surface of the liquid crystal panel 74.

In the backlight 70, the back chassis 71 is curved toward vertical and horizontal end faces of the backlight 70, and the light-source circuit unit 1 is correspondingly curved. In this light-source circuit unit 1, a pitch between the LED chips 13 is narrower at a position nearer to each of the vertical and horizontal end faces in response to an increase in the curvature. A drive current applied to the LED chips 13 is also decreased with a decrease in the pitch, or an increase in the density of the LED chips. The rear cover 76 also has a taper 76A in correspondence to the curvature of the back chassis 71.

Specifically, the back chassis 71 and the light-source circuit unit 1 are curved to reduce thickness at a position nearer to each of their vertical and horizontal end faces, and the rear cover 76 correspondingly has the taper 76A so that the liquid crystal display device as a whole appears thin. In the liquid crystal display device having such a configuration, the LED chip 13 of the light-source circuit unit 1 has a shorter optical distance from the liquid crystal panel 74 at a position nearer to each end face of the light-source circuit unit 1, and thus if pitches between the chips are even, spot-like luminance unevenness caused by the LED chips occurs. In the application example 4, a pitch between the LED chips 13 is varied in correspondence to the degree of the curvature of the light-source circuit unit 1, and the drive current applied to the LED chips 13 is also varied in response to the varied pitch. This makes it possible to control the surface luminance of the liquid crystal panel 74 to be uniform.

(Application Example) 5

Figure 12:
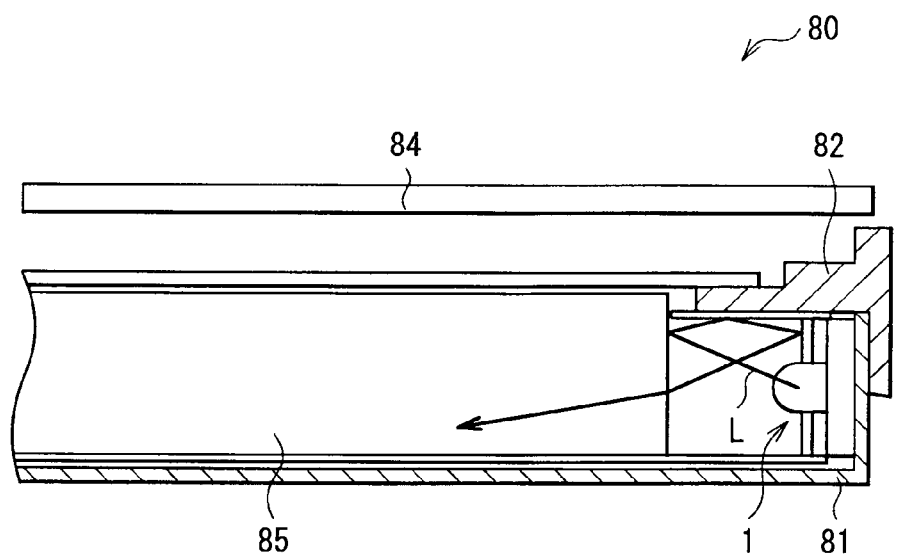
FIG. 12 is a sectional view illustrating a liquid crystal display device according to application example 5.

FIG. 12 illustrates a configuration of a liquid crystal display device including an edge-type backlight. A backlight 80 includes, for example, the light-source circuit unit 1 that is disposed on a sidewall of a back chassis 81 (support member) so as to be opposed to an end face of a light guide plate 81. A middle chassis 82 supports a diffuser sheet 83 above the light-source circuit unit 1. A liquid crystal panel 84 is provided in front of the backlight 80.

In the liquid crystal display device, radiation direction of light L extracted from the sealing lens 12 of the light-source circuit unit 1 is changed by the light guide plate 81 so that the light goes to the diffuser sheet 83. After that, as in the case shown in FIG. 8, the light L largely passes through the diffuser sheet 83 and reaches the liquid crystal panel 84, and part of the light L is reflected by the diffuser sheet 83. The reflected light is returned to the diffuser sheet 83 by the above-described white resist layer or reflective sheet and reaches the liquid crystal panel 84, resulting in image display.

Figure 13:
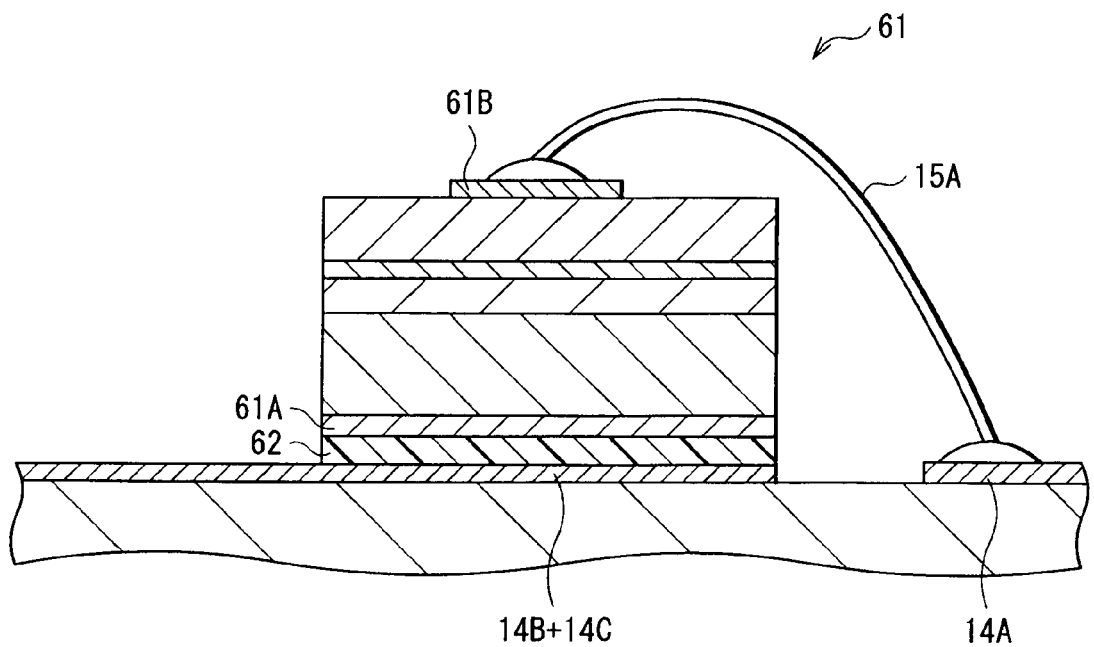
FIG. 13 illustrates a wiring configuration of another LED chip.

While the technology has been described with the embodiment and the modifications hereinbefore, the technology is not intended to be limited to the embodiment and the like, and may contain various modifications or alterations. For example, while the embodiment and the like have been described with the LED chip 13 having the two electrodes on one side, a type of LED chip 61 as shown in FIG. 13 may be used, where an n-type electrode 61A and a p-type electrode 61B are oppositely provided on the respective two sides of the LED chip. In such a case, the chip mounting layer 14C is formed in an integrated manner with the wiring layer 14B, and the transparent paste 62 is configured of a conductive material. Specifically, a drive current is supplied to the p-type electrode 61B of the LED chip 61 through the wiring layer 14A and the wiring 15A, and supplied to the n-type electrode 61A through the wiring layer 14B and the chip mounting layer 14C.

The present technology may have the following configurations.

(1) A light-source circuit unit including:

a circuit substrate that has a light-reflective wiring pattern on a surface thereof and includes a chip mounting layer as a part of the wiring pattern; and one or more light-emitting element chips that are directly placed on the chip mounting layer, and are driven by a current flowing through the wiring pattern.

(2) The light-source circuit unit according to (1), further including a sealing lens on the circuit substrate, the sealing lens covering the light-emitting element chip and the periphery thereof.

(3) The light-source circuit unit according to (1) or (2), wherein the light-emitting element chip is configured of a light-emitting diode.

(4) The light-source circuit unit according to any one of (1) to (3), wherein the light-emitting element chip has a pair of electrodes on one side, and the wiring pattern includes first and second wiring layers that electrically connect the chip mounting layer to the respective two electrodes of the light-emitting element chip.

(5) The light-source circuit unit according to any one of (1) to (4), wherein the light-emitting element chip has first and second electrodes on respective two sides thereof, and the wiring pattern includes a first wiring layer that serves as the chip mounting layer and is electrically connected with the first electrode of the light-emitting element chip, and a second wiring layer electrically connected with the second electrode of the light-emitting element chip.

(6) The light-source circuit unit according to any one of (1) to (5), further including:

a white resist layer between the wiring pattern and the sealing lens; and a reflective layer formed of the same material as the white resist layer between sub-patterns of the wiring pattern in a region covered with the sealing lens.

(7) The light-source circuit unit according to any one of (1) to (4), further including a reflective layer at least between sub-patterns of the wiring pattern in a region covered with the sealing lens on the circuit substrate, the reflective layer being formed of the same material as the wiring pattern.

(8) The light-source circuit unit according to any one of (1) to (7), further including a reflective sheet having an opening corresponding to the sealing lens over the entire area above the circuit substrate.

(9) The light-source circuit unit according to any one of (1) to (8), wherein the circuit substrate is configured of a resin film having the wiring pattern printed thereon, a reflective metal substrate having an insulating film on a surface thereof and the wiring pattern printed on the insulating film, or a glass-contained resin film having the wiring pattern printed thereon.

(10) The light-source circuit unit according to any one of (1) to (9), wherein two or more light-emitting element chips are provided on the circuit substrate, and the reflective layer is provided over the entire surface of the circuit substrate including a region between the light-emitting element chips.

(11) The light-source circuit unit according to any one of (1) to (10), wherein a heat-radiating metal sheet is laminated on the back surface of the circuit substrate.

(12) An illumination device including:
a light-source circuit unit;
a support member that supports the light-source circuit unit therein; and
a diffuser sheet disposed oppositely to the entire area of the light-source circuit unit,
wherein the light-source circuit unit includes a circuit substrate that has a light-reflective wiring pattern on a surface thereof and includes a chip mounting layer as a part of the wiring pattern, and a plurality of light-emitting element chips that are directly placed on the chip mounting layer, and are driven by a current flowing through the wiring pattern.

(13) An illumination device including:
a light guide plate;
a support member that supports the light guide plate therein;
a diffuser sheet disposed oppositely to the entire area of the light guide plate; and
a light-source circuit unit disposed oppositely to an end face of the light guide plate in the support member,
wherein the light-source circuit unit includes
a circuit substrate that has a light-reflective wiring pattern on a surface thereof and includes a chip mounting layer as a part of the wiring pattern, and
a plurality of light-emitting element chips that are directly placed on the chip mounting layer, and are driven by a current flowing through the wiring pattern.

(14) An illumination device including:
a support member having a through-hole from the front surface to the back surface of the support member;
an optical sheet supported in front of the support member;
a drive substrate having a connector and disposed on the back surface of the support member; and
a foldable light-source circuit unit that is disposed between the optical sheet and the support member, extends to the back surface of the support member through the through-hole, and is electrically connected to the drive substrate via the connector,
wherein the light-source circuit unit includes
a circuit substrate that has a light-reflective wiring pattern on a surface thereof and includes a chip mounting layer as a part of the wiring pattern, and
one or more light-emitting element chips that are directly placed on the chip mounting layer, and are driven by a current flowing through the wiring pattern.

(15) An illumination device including:
a support member having a through-hole from the front surface to the back surface of the support member;
an optical sheet supported in front of the support member;
a drive substrate having a connector and disposed on the back surface of the support member;
a plurality of light-source circuit units provided in parallel between the optical sheet and the support member; and
a foldable connection member that extends from the inside of the support member to the back surface thereof through the through-hole, and is electrically connected to each of the plurality of light-source circuit units via an anisotropic conductive resin, and to the drive substrate via the connector,
wherein the light-source circuit unit includes
a circuit substrate that has a light-reflective wiring pattern on a surface thereof and includes a chip mounting layer as a part of the wiring pattern, and
one or more light-emitting element chips that are directly placed on the chip mounting layer, and are driven by a current flowing through the wiring pattern.

(16) An illumination device including:
an optical sheet;
a support member having a curved bottom that allows a distance from the optical sheet to be gradually reduced from the center of the support member to an end face thereof;
a foldable light-source circuit unit that has a plurality of light-emitting element chips in (one or more) rows and is accommodated in the support member along the curved bottom; and
a back protective member that covers the entire back surface of the support member from the neighborhoods of both ends of the optical sheet, and has an inclined surface according to the curved bottom of the support member,
wherein the light-source circuit unit includes
a circuit substrate that has a light-reflective wiring pattern on a surface thereof and includes a chip mounting layer as a part of the wiring pattern, and
one or more light-emitting element chips that are directly placed on the chip mounting layer, and are driven by a current flowing through the wiring pattern.

(17) The illumination device according to (16), wherein a pitch of the plurality of light-emitting element chips arranged in a row direction is narrowed with a decrease in width of the accommodating space.

(18) The illumination device according to (17), wherein a drive current applied to the plurality of light-emitting element chips is adjusted to allow surface luminance to be uniform, in response to the pitch of the plurality of light-emitting element chips arranged in the row direction.

(19) A display device including:
a display panel; and
a light-source circuit unit as a light source for the display panel,
wherein the light-source circuit unit includes
a circuit substrate that has a light-reflective wiring pattern on a surface thereof and includes a chip mounting layer as a part of the wiring pattern, and
one or more light-emitting element chips that are directly placed on the chip mounting layer, and are driven by a current flowing through the wiring pattern.

The present disclosure contains subject matter related to that disclosed in Japanese Priority Patent Application JP 2011-64582 filed in the Japan Patent Office on Mar. 23, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A light-source circuit unit comprising:
a circuit substrate that has a light-reflective wiring pattern on a surface thereof and includes a chip mounting layer as a part of the light-reflective wiring pattern;
one or more light-emitting element chips that are directly placed on the chip mounting layer, and are driven by a current flowing through the light-reflective wiring pattern; and
a reflective layer between sub-patterns of the light-reflective wiring pattern in a region covered with a sealing lens on the circuit substrate, the reflective layer being formed of a same material as the light-reflective wiring pattern.
2. The light-source circuit unit according to claim 1, wherein the sealing lens covers the one or more light-emitting element chips and a periphery thereof.

3. The light-source circuit unit according to claim 1, wherein each of the one or more light-emitting element chips includes a light-emitting diode.

4. The light-source circuit unit according to claim 1, wherein
 each of the one or more light-emitting element chips has a pair of electrodes on one side, and
 the light-reflective wiring pattern includes first and second wiring layers that electrically connect the chip mounting layer to respective pairs of electrodes of each of the one or more light-emitting element chips.

5. The light-source circuit unit according to claim 1, wherein each of the one or more light-emitting element chips has a first electrode and a second electrode on two respective sides thereof, and
 the light-reflective wiring pattern includes a first wiring layer that serves as the chip mounting layer and is electrically connected to the first electrode of each of the one or more light-emitting element chips, and a second wiring layer electrically connected with the second electrode of each of the one or more light-emitting element chips.

6. The light-source circuit unit according to claim 1, further comprising:
 a white resist layer between the light-reflective wiring pattern and the sealing lens, wherein
 the reflective layer is formed of a same material as the white resist layer between sub-patterns of the light-reflective wiring pattern in the region covered with the sealing lens.

7. The light-source circuit unit according to claim 1, further comprising a reflective sheet having an opening corresponding to the one or more light-emitting element chips over an entire area above the circuit substrate.

8. The light-source circuit unit according to claim 1, wherein the circuit substrate is composed of a resin film having the light-reflective wiring pattern printed thereon, a reflective metal substrate having an insulating film on a surface thereof and the light-reflective wiring pattern printed on the insulating film, or a glass-contained resin film having the light-reflective wiring pattern printed thereon.

9. The light-source circuit unit according to claim 1, wherein
 two or more light-emitting element chips are provided on the circuit substrate, and
 the reflective layer is provided over an entire surface of the circuit substrate including a region between the two or more light-emitting element chips.

10. The light-source circuit unit according to claim 1, wherein a heat-radiating metal sheet is laminated on a back surface of the circuit substrate.

11. An illumination device comprising:
 a light-source circuit unit;
 a support member that supports the light-source circuit unit therein; and
 a diffuser sheet disposed opposite to an entire area of the light-source circuit unit,
 wherein the light-source circuit unit includes:
  a circuit substrate that has a light-reflective wiring pattern on a surface thereof and includes a chip mounting layer as a part of the light-reflective wiring pattern,
  a plurality of light-emitting element chips that are directly placed on the chip mounting layer, and are driven by a current flowing through the light-reflective wiring pattern, and
  a reflective layer between sub-patterns of the light-reflective wiring pattern in a region covered with a sealing lens on the circuit substrate, the reflective layer being formed of a same material as the light-reflective wiring pattern.

12. An illumination device comprising:
 a light guide plate;
 a support member that supports the light guide plate therein;
 a diffuser sheet disposed opposite to an entire area of the light guide plate; and
 a light-source circuit unit disposed opposite to an end face of the light guide plate in the support member,
 wherein the light-source circuit unit includes:
  a circuit substrate that has a light-reflective wiring pattern on a surface thereof and includes a chip mounting layer as a part of the light-reflective wiring pattern,
  a plurality of light-emitting element chips that are directly placed on the chip mounting layer, and are driven by a current flowing through the light-reflective wiring pattern, and
  a reflective layer between sub-patterns of the light-reflective wiring pattern in a region covered with a sealing lens on the circuit substrate, the reflective layer being formed of a same material as the light-reflective wiring pattern.

13. An illumination device comprising:
 a support member having a through-hole from a front surface to a back surface of the support member;
 an optical sheet supported in front of the support member;
 a drive substrate having a connector and disposed on the back surface of the support member; and
 a foldable light-source circuit unit that is disposed between the optical sheet and the support member, extends to the back surface of the support member through the through-hole, and is electrically connected to the drive substrate via the connector,
 wherein the foldable light-source circuit unit includes:
  a circuit substrate that has a light-reflective wiring pattern on a surface thereof and includes a chip mounting layer as a part of the light-reflective wiring pattern, and
  one or more light-emitting element chips that are directly placed on the chip mounting layer, and are driven by a current flowing through the light-reflective wiring pattern.

14. An illumination device comprising:
 a support member having a through-hole from a front surface to a back surface of the support member;
 an optical sheet supported in front of the support member;
 a drive substrate having a connector and disposed on the back surface of the support member;
 a plurality of light-source circuit units provided in parallel between the optical sheet and the support member; and
 a foldable connection member that extends from an inside of the support member to the back surface thereof through the through-hole, and is electrically connected to each of the plurality of light-source circuit units via an anisotropic conductive resin, and to the drive substrate via the connector,
 wherein each of the plurality of light-source circuit units includes:
  a circuit substrate that has a light-reflective wiring pattern on a surface thereof and includes a chip mounting layer as a part of the light-reflective wiring pattern, and one or more light-emitting element chips that are directly placed on the chip mounting layer, and are driven by a current flowing through the light-reflective wiring pattern.

15. An illumination device comprising:

an optical sheet;

a support member having a curved bottom that allows a distance from the optical sheet to be gradually reduced from a center of the support member to an end face thereof;

a foldable light-source circuit unit that has a plurality of light-emitting element chips in one or more rows and is accommodated in the support member along the curved bottom; and a back protective member that covers an entire back surface of the support member from both ends of the optical sheet, and has an inclined surface according to the curved bottom of the support member, wherein the foldable light-source circuit unit includes:

a circuit substrate that has a light-reflective wiring pattern on a surface thereof and includes a chip mounting layer as a part of the light-reflective wiring pattern, and one or more light-emitting element chips that are directly placed on the chip mounting layer, and are driven by a current flowing through the light-reflective wiring pattern.

16. The illumination device according to claim 15, wherein a pitch of the plurality of light-emitting element chips arranged in a row direction is narrowed with a decrease in width of an accommodating space.

17. The illumination device according to claim 16, wherein a drive current applied to the plurality of light-emitting element chips is adjusted to allow surface luminance to be uniform, in response to the pitch of the plurality of light-emitting element chips arranged in the row direction.

18. A display device comprising:

a display panel; and a light-source circuit unit as a light source for the display panel, wherein the light-source circuit unit includes:

a circuit substrate that has a light-reflective wiring pattern on a surface thereof and includes a chip mounting layer as a part of the light-reflective wiring pattern, one or more light-emitting element chips that are directly placed on the chip mounting layer, and are driven by a current flowing through the light-reflective wiring pattern, and a reflective layer between sub-patterns of the light-reflective wiring pattern in a region covered with a sealing lens on the circuit substrate, the reflective layer being formed of a same material as the light-reflective wiring pattern.

19. A light-source circuit unit comprising:

a circuit substrate that has a light-reflective wiring pattern on a surface thereof and includes a chip mounting layer as a part of the light-reflective wiring pattern;

one or more light-emitting element chips that are directly placed on the chip mounting layer, and are driven by a current flowing through the light-reflective wiring pattern; and a white resist layer between the light-reflective wiring pattern and a sealing lens on the circuit substrate, wherein a reflective layer is formed of a same material as the white resist layer between sub-patterns of the light-reflective wiring pattern in a region covered with the sealing lens on the circuit substrate.

20. A light-source circuit unit comprising:

a circuit substrate that has a light-reflective wiring pattern on a surface thereof and includes a chip mounting layer as a part of the light-reflective wiring pattern;

one or more light-emitting element chips that are directly placed on the chip mounting layer, and are driven by a current flowing through the light-reflective wiring pattern; and a reflective sheet having an opening corresponding to the one or more light-emitting element chips over an entire area above the circuit substrate.

* * * * *